(12) United States Patent
Stegamat et al.

(10) Patent No.: US 7,550,915 B2
(45) Date of Patent: Jun. 23, 2009

(54) ORGANIC ELECTRONIC DEVICE WITH HOLE INJECTION

(75) Inventors: Reza Stegamat, Milpitas, CA (US); Vi-En Choong, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 66 days.

(21) Appl. No.: 10/843,803

(22) Filed: May 11, 2004

(65) Prior Publication Data

US 2005/0253503 A1  Nov. 17, 2005

(51) Int. Cl.
*H05B 33/04* (2006.01)
*H05B 33/10* (2006.01)

(52) U.S. Cl. ............... 313/504; 313/506; 428/690

(58) Field of Classification Search ......... 313/504–506; 428/690, 917
See application file for complete search history.

(56) References Cited

U.S. PATENT DOCUMENTS

| | | | | |
|---|---|---|---|---|
| 5,529,853 A * | 6/1996 | Hamada et al. | ............. | 428/690 |
| 5,540,999 A * | 7/1996 | Yamamoto et al. | ....... | 428/411.1 |
| 5,965,281 A * | 10/1999 | Cao | ............. | 428/690 |
| 6,361,886 B2 | 3/2002 | Shi | | |
| 6,573,651 B2 | 6/2003 | Adachi | | |
| 6,580,094 B1 | 6/2003 | Yamazaki | | |
| 6,656,608 B1 * | 12/2003 | Kita et al. | ............. | 428/690 |
| 6,687,266 B1 | 2/2004 | Ma | | |
| 6,692,820 B2 | 2/2004 | Forrest | | |
| 6,831,406 B1 * | 12/2004 | Fukuyama et al. | ............. | 313/504 |
| 6,991,880 B2 * | 1/2006 | Tong et al. | ............. | 430/58.15 |
| 7,045,952 B2 * | 5/2006 | Lu | ............. | 313/504 |
| 2003/0010959 A1 * | 1/2003 | Lee et al. | ............. | 252/500 |

OTHER PUBLICATIONS

J.L. Bredas et al., "Conjugated Polymers", Kluwer Academic Publishers, Dordrecht, The Netherlands, 1991.
US 6,689,280, 02/2004, Ogino (withdrawn)

* cited by examiner

*Primary Examiner*—Nimeshkumar D. Patel
*Assistant Examiner*—Anne M Hines
(74) *Attorney, Agent, or Firm*—Cohen Pontani Lieberman & Pavane LLP

(57) ABSTRACT

In a first embodiment of the present invention, in order to increase the number of holes injected into the emissive layer, an intermixed layer is formed from the intermixing of the hole transport layer ("HTL") and the emissive layer. The intermixed layer is between the HTL and the emissive layer of the OLED device. Alternatively, in a second embodiment of the present invention, in order to increase the number of holes injected into the emissive layer, a separate interlayer is incorporated within the OLED device. The interlayer is comprised of a hole transport material in which one of its components is at least partially replaced with one of the components of the emissive layer that is responsible for hole injection and transport. The separate interlayer is between the anode and the emissive layer of the OLED device. One or more intermediate layers may be present between the interlayer and the anode such as, for example, a HTL may be present between those two layers.

11 Claims, 5 Drawing Sheets

305

ORGANIC ELECTRONIC DEVICE WITH HOLE INJECTION

BACKGROUND OF THE INVENTION

An organic light emitting diode ("OLED") device typically includes, for example: (1) an anode on a substrate; (2) a hole transport layer ("HTL") on the anode; (3) an electron transporting and light emitting layer ("emissive layer") on the HTL; and (4) a cathode on the emissive layer. When the device is forward biased, holes are injected from the anode into the HTL, and the electrons are injected from the cathode into the emissive layer. Both carriers are then transported towards the opposite electrode and allowed to recombine with each other in the device, the location of which is called the recombination zone.

FIG. 1 shows an energy level diagram for a prior art OLED device. In FIG. 1, the ionization potential ("IP") is the energy difference between the vacuum level and the highest occupied molecular orbital ("HOMO") level. The vacuum level is usually referred to as the reference level from which the energy levels are measured. The HOMO is the highest energy level filled with electrons and in which the holes are free to move. Similarly, the lowest unoccupied molecular orbital ("LUMO") is the lowest energy level devoid of electrons and in which free electrons are free to move. The energy difference between the HOMO level and the LUMO level is the band-gap within which there are no available molecular orbital states. The IP value is a measure of the minimum energy, expressed in electron volts ("eV"), required to remove an electron from an atom. The IP for an anode comprised of indium tin oxide ("ITO") is typically 4.8 eV. The IP for a HTL comprised of polyethylenedioxythiophene ("PEDOT") and polystyrenesulfonic acid ("PSS") (this is referred to, herein, as PEDOT:PSS) is typically 5.0 eV. The IP for an emissive layer comprised of blue emissive polymer material is typically from 5.8 eV to 6.0 eV. The work function for a cathode that includes an electron injecting layer comprised of, for example, barium or calcium is typically between 2.0 eV and 3.0 eV. The energy barrier is the difference between the energy levels of two adjacent layers. In this device configuration, there is usually a large energy barrier for hole injection at the interface between the HTL and the emissive layer that suppresses the injection of holes into the emissive layer. The energy barrier is considered large if, for example, there is a gap of 0.2 eV to 1.0 eV.

In this device configuration, the emissive layer is typically hole deficient. The hole deficiency can be caused by electrical or physical factors. For the former, the large energy barrier for hole injection at the interface between the HTL and the emissive layer suppresses the injection of holes into the emissive layer. For the latter, incompatibility between the emissive layer and the HTL may result in the emissive layer solution used to form the emissive layer not adequately wetting the surface of the HTL thus causing the coverage and adhesion of the emissive layer to the HTL to not be uniform and robust and this may suppress the injection of holes into the emissive layer. A deficiency of holes in the emissive layer results in reduced device efficiency since only a sub-optimal number of electrons are recombining. In addition, the lack of sufficient number of holes results in a shift of the recombination zone to the interface between the HTL and the emissive and this decreases the lifetime and efficiency of the device.

Therefore, in order to improve device efficiency and lifetime, the number of holes reaching the emissive layer should be increased.

SUMMARY

A first configuration of a first embodiment of a method to fabricate an OLED device is described. This configuration of the method includes the following acts: forming an anode on a substrate; adding a first surfactant to a HTL solution and/or a second surfactant to an EL solution; forming a hole transport layer on the anode by depositing the HTL solution on the anode and allowing the HTL solution to dry; depositing the EL solution on the hole transport layer, and a portion of this deposited EL solution dissolves a portion of the hole transport layer thus producing an intermixed solution; and allowing the intermixed solution and the EL solution to dry to form: (1) an intermixed layer on the hole transport layer and (2) an emissive layer on the intermixed layer. The resulting intermixed layer has a range of IPs between a highest IP of an adjacent layer on an anode-end and a lowest IP of an adjacent layer on an "emissive layer"-end.

A second configuration of the first embodiment of the method to fabricate the OLED device is described. This second configuration includes the following acts: forming an anode on a substrate; adding a particular one of the first components of a HTL solution to an EL solution so that it is one of the second components of the EL solution; forming a hole transport layer on the anode; depositing the EL solution on the hole transport layer, and a portion of this EL solution dissolves a portion of the hole transport layer thus producing an intermixed solution; and allowing the intermixed solution and the EL solution to dry to form: (1) an intermixed layer on the hole transport layer, and (2) an emissive layer on the intermixed layer. The resulting intermixed layer has a range of IPs between a highest IP of an adjacent layer on an anode-end and a lowest IP of an adjacent layer on an "emissive layer"-end.

A third configuration of the first embodiment of the method to fabricate the OLED device is described. This third configuration includes the following acts: forming an anode on a substrate; depositing a HTL solution on the anode where the HTL solution includes a first non-aqueous solvent; allowing the HTL solution to dry to form a hole transport layer; and depositing an EL solution on the hole transport layer. The EL solution includes a second non-aqueous solvent and a portion of the EL solution dissolves a portion of the hole transport layer resulting in an intermixed solution. The third configuration of the method also includes the act of allowing the intermixed solution and the EL solution to dry to form: (1) an intermixed layer on the hole transport layer, and (2) an emissive layer on the intermixed layer. The resulting intermixed layer has a range of IPs between a highest IP of an adjacent layer on an anode-end and a lowest IP of an adjacent layer on an "emissive layer"-end.

A fourth configuration of the first embodiment of the method to fabricate the OLED device is described. This fourth configuration includes the following acts: forming an anode on a substrate; depositing a HTL solution on the anode; allowing the HTL solution to dry to form a hole transport layer; depositing an EL solution on the hole transport layer, and a portion of this EL solution dissolves a portion of the hole transport layer thus producing an intermixed solution; allowing the intermixed solution and the EL solution to dry to form: (1) an intermixed layer on the hole transport layer, and (2) an emissive layer on the intermixed layer; and after the intermixed solution and the EL solution are allowed to dry, baking together the hole transport layer, the intermixed layer, and the emissive layer to increase an amount of intermixing between the hole transport layer and the emissive layer. The resulting intermixed layer has a range of IPs between a highest IP of an adjacent layer on an anode-end and a lowest IP of an adjacent layer on an "emissive layer"-end.

A second embodiment of the method to fabricate the OLED device is described. This embodiment includes the following acts: forming an anode on a substrate; forming an interlayer on the anode; and forming an emissive layer on the interlayer. The emissive layer includes multiple first components and a particular one of the first components is responsible for hole injection and transport. The interlayer includes multiple second components and a particular one of the second components is the particular one of the first components that is responsible for hole injection and transport. The resulting interlayer has a range of IPs between a highest IP of an adjacent layer on an anode-end and a lowest IP of an adjacent layer on an "emissive layer"-end.

DETAILED DESCRIPTION

In a first embodiment of the present invention, in order to increase the number of holes injected into the emissive layer, an intermixed layer is formed from the intermixing of the HTL and the emissive layer. The intermixed layer is between the HTL and the emissive layer of the OLED device. Alternatively, in a second embodiment of the present invention, in order to increase the number of holes injected into the emissive layer, a separate interlayer is incorporated within the OLED device. The interlayer is comprised of a hole transport material in which one of its components is at least partially replaced with one of the components of the emissive layer that is responsible for hole injection and transport. The separate interlayer is between the anode and the emissive layer of the OLED device. One or more intermediate layers may be present between the interlayer and the anode such as, for example, a HTL may be present between those two layers.

The intermixed layer and the interlayer have an IP range between the highest IP value of the adjacent layer on the anode-end (e.g., the HTL) and the lowest IP value of the adjacent layer on the "emissive layer"-end (e.g., the emissive layer). The presence of either of these layers in the device increases the number of holes that can reach the emissive layer. This is due in part to the layer (e.g., the intermixed layer or the interlayer) providing intermediate HOMO energy states (e.g., "steps") that allow the holes to more easily inject from an adjacent layer to the emissive layer. The intermediate HOMO energy states allow more holes to reach the emissive layer because, for example, the holes can more easily overcome the two smaller energy barriers resulting from the presence of the intermixed layer or the interlayer than overcome one large energy barrier. Rather than the one large energy barrier between the HTL and the emissive layer, the presence of the intermixed layer or the interlayer results in the following two smaller energy barriers: (1) the barrier between the HTL and the intermixed layer or the interlayer, and (2) the barrier between the intermixed layer or the interlayer and the emissive layer. Also, by improving the compatibility between the emissive layer and the adjacent layer on the anode-end (e.g., the adjacent layer can be the HTL or a separate interlayer), the emissive layer will better intermix with the underlying layer and thus the emissive layer will have a stronger adhesion to the underlying layer and also the number of holes injected into the emissive layer will increase.

The presence of the intermixed layer or the interlayer within the device improves the device lifetime and efficiency. If the number of holes injected into the emissive layer is increased, then the efficiency of the device will also increase since the number of holes will be closer to the number of electrons resulting in more recombinations inside the emissive layer and away from the "HTL/emissive layer" interface.

Figure 1:
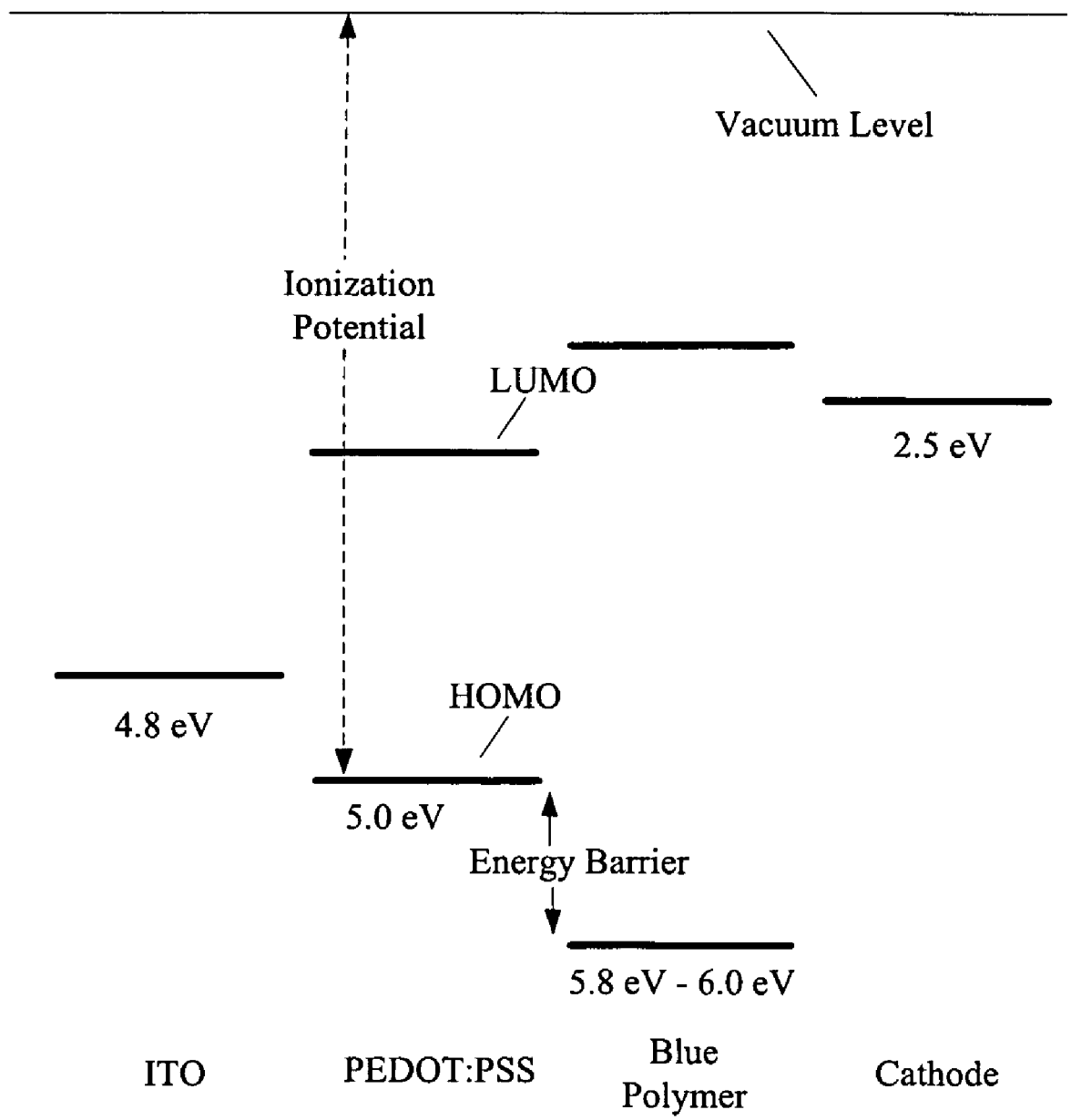
FIG. 1 shows an energy level diagram for a prior art OLED device.
Figure 2:
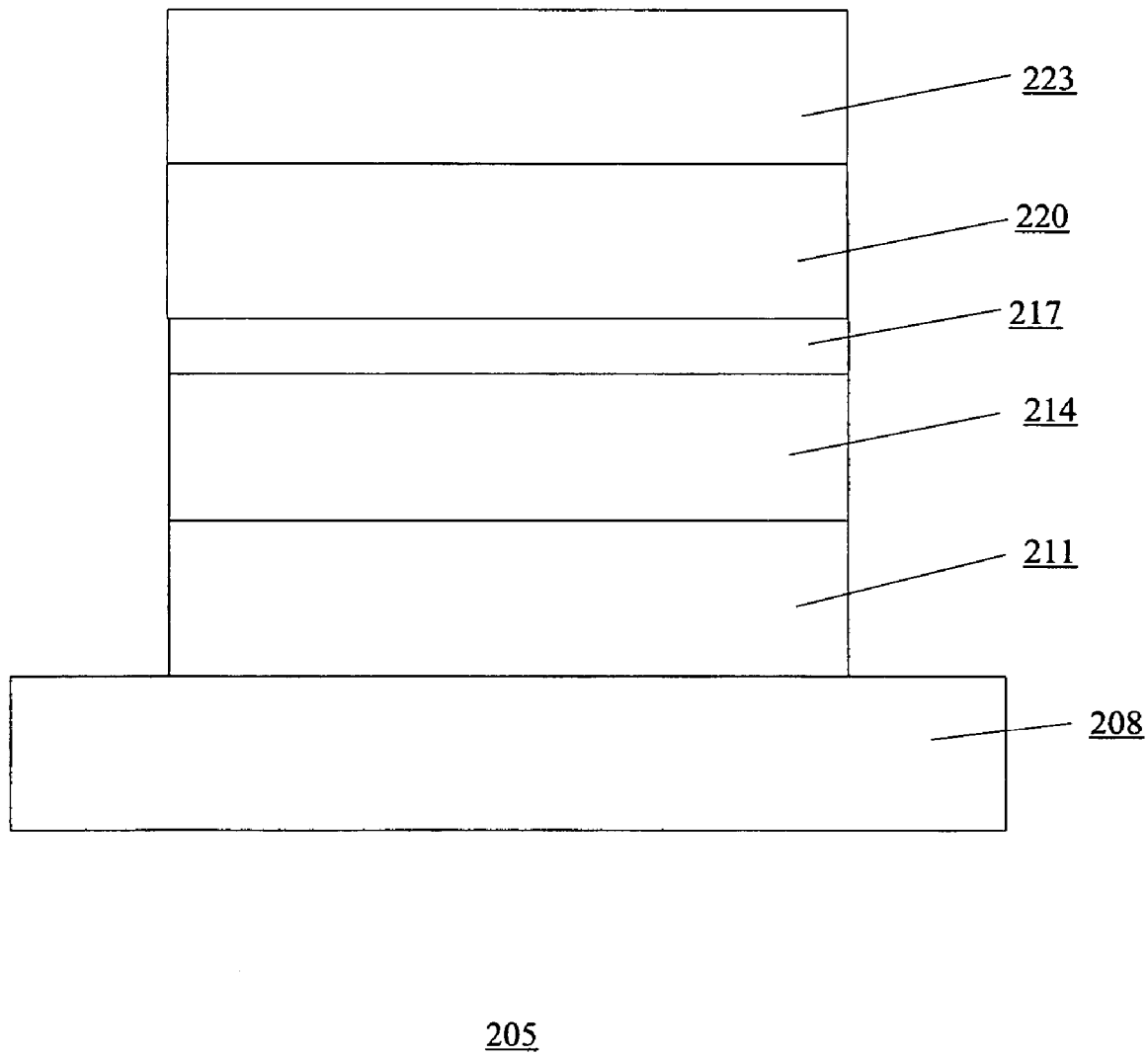
FIG. 2 shows a cross-sectional view of a first embodiment of an OLED device according to the present invention.

FIG. 2 shows a cross-sectional view of a first embodiment of an OLED device 205 according to the present invention. The OLED device 205 can be, for example, an OLED display, or an OLED light source used for general purpose lighting. In FIG. 2, an anode 211 is on a substrate 208. As used within the specification and the claims, the term "on" includes when there is direct physical contact between the two parts (e.g., layers) and when there is indirect contact between the two parts because they are separated by one or more intervening parts. A HTL 214 is on the anode 211. An intermixed layer 217 is on the HTL 214. An emissive layer 220 is on the intermixed layer 217. A cathode 223 is on the emissive layer 220. The OLED device 205 may include other layers such as, for example, insulating layers between the anode 211 and the HTL 214, and/or between the emissive layer 220 and the cathode 223.

Figure 3:
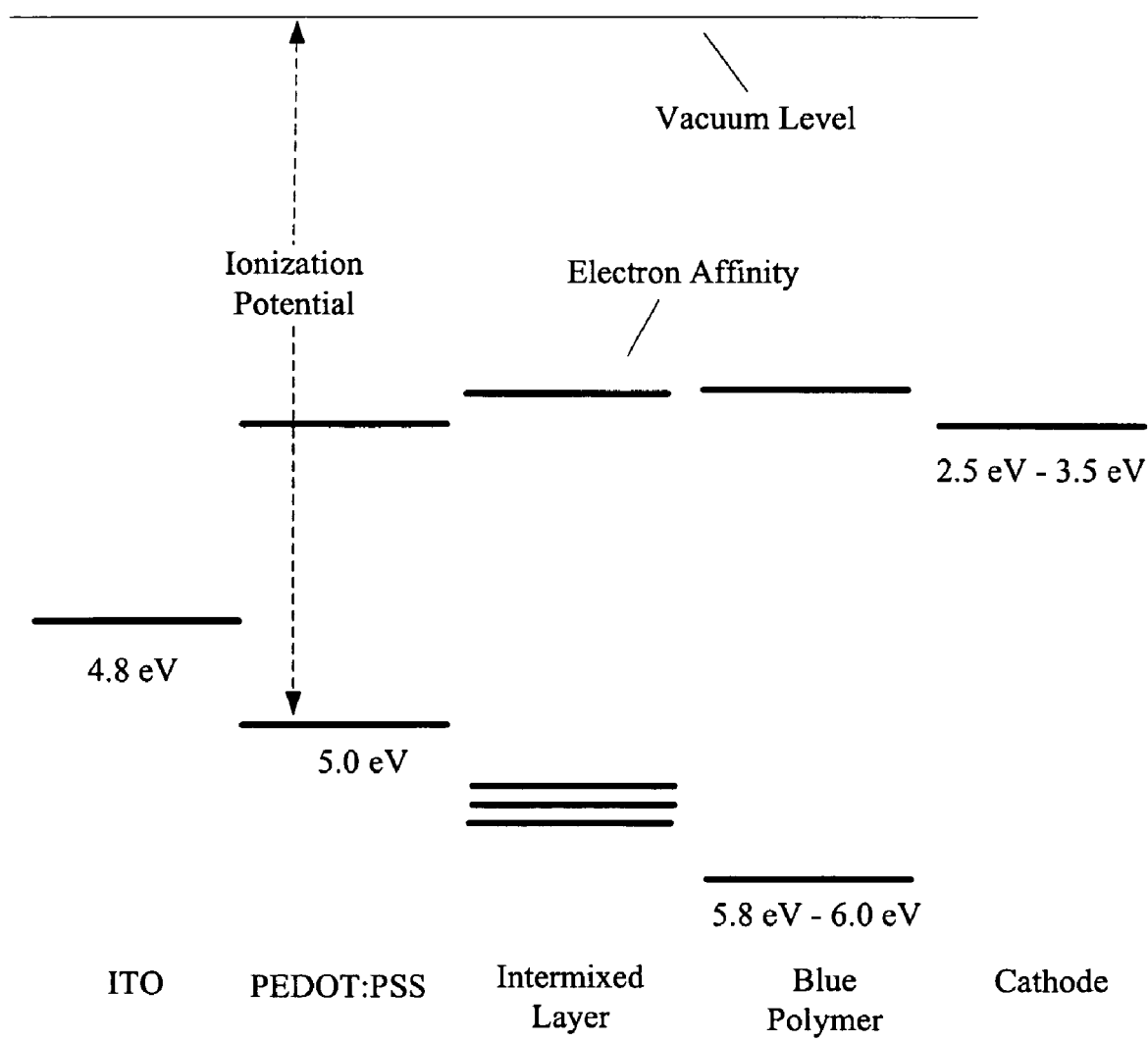
FIG. 3 shows an energy level diagram of an example of a first embodiment of the OLED device.

FIG. 3 shows an energy level diagram of an example of a first embodiment of the OLED device. The work function for an anode comprised of indium tin oxide ("ITO") is typically 4.8 eV. The IP for a HTL comprised of PEDOT:PSS is typically 5.0 eV. The intermixed layer provides multiple intermediate HOMO energy states between the PEDOT:PSS layer and the blue polymer layer. The IP range of the HOMO energy states of the intermixed layer is between the IP of the PEDOT:PSS layer and the IP of the blue polymer layer. For example, the IP of the blue polymer layer is between 5.8 eV and 6.0 eV. The cathode typically includes an electron injecting layer that is comprised of, for example, barium, calcium, or a metal fluoride, and also includes a conductive layer comprised of, for example, silver or aluminum. The cathode typically has a work function between 2.5 eV to 3.5 eV. By incorporating the intermixed layer in the device, a greater number of holes can reach the blue polymer layer than if the intermixed layer was not present. This is due in part to holes being able to more easily overcome the two smaller energy barriers between (1) the PEDOT:PSS layer and the intermixed layer and (2) the intermixed layer and the blue polymer layer than for holes to overcome the larger energy barrier between the PEDOT:PSS layer and the blue polymer layer.

Some of the layers of the OLED device are described in greater detail below.

Substrate 208:

The substrate 208 can be any material, which can support the layers on it. The substrate 208 can be transparent or opaque (e.g., the opaque substrate is used in top-emitting devices). By modifying or filtering the wavelength of light which can pass through the substrate 208, the color of light emitted by the device can be changed. Preferable substrate materials include glass, quartz, silicon, stainless steel, and plastic; preferably, the substrate 208 is comprised of thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

Anode 211:

The anode 211 is comprised of a high work function material; for example, the anode 211 can have a work function greater than about 4.5 eV. Typical anode materials include metals (e.g., platinum, gold, palladium, nickel, indium, and the like); metal oxides (e.g., tin oxide, indium tin oxide ("ITO"), and the like); graphite; doped inorganic semiconductors (e.g., silicon, germanium, gallium arsenide, and the like); and highly doped conducting polymers (e.g., polyaniline, polypyrrole, polythiophene, and the like).

The anode 211 can be transparent, semi-transparent, or opaque to the wavelength of light generated within the device. The thickness of the anode 211 is from about 10 nm to about 1000 nm, and preferably, from about 50 nm to about 200 nm.

The anode 211 can typically be fabricated using any of the techniques known in the art for deposition of thin films, including, for example, vacuum evaporation, sputtering, electron beam deposition, or chemical vapor deposition.

Hole Transport Layer ("HTL") 214:

The HTL 214 has a much higher hole mobility than electron mobility and is used to effectively transport holes from the anode 211. The HTL 214 is comprised of, for example, polymer organic materials such as PEDOT:PSS, polyaniline ("PANI"), or polypyrole.

The HTL 214 functions as: (1) a buffer to provide a good bond to the substrate; and/or (2) a hole injection layer to promote hole injection; and/or (3) a HTL to promote hole transport.

The HTL 214 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

Intermixed Layer 217:

The intermixed layer 217 has an IP range between the highest IP value of the adjacent layer on the anode-end (e.g., the HTL 214) and the lowest IP value of the adjacent layer on the "emissive layer"-end (e.g., the emissive layer 220).

In a first configuration of the first embodiment of the OLED device, a surfactant is added to a HTL solution and/or an emissive layer ("EL") solution. The HTL solution is deposited on the anode 211 and upon drying, forms the HTL 214. Then, the EL solution is deposited on the HTL 214. The EL solution dissolves a portion of the HTL 214 at the interface producing an intermixed solution. The intermixed solution and the EL solution are allowed to dry to form the intermixed layer 217 which is on the HTL 214, and the emissive layer 220 which is on the intermixed layer 217. If the surfactant is added to the HTL solution, it reduces the surface tension of the solution allowing it more easily and evenly spread across the underlying layer (e.g., the anode 211). Alternatively or in addition, if the surfactant is added to the EL solution, it reduces the surface tension of this solution allowing it more easily and evenly spread across the HTL 214. The addition of the surfactant to the HTL solution and/or the EL solution may increase the amount of intermixing between the hole transporting layer and the EL solution thus the emissive layer will have a stronger adhesion to the intermixed layer and also the number of holes injected into the emissive layer will increase.

For this first configuration, the HTL solution can include the organic polymers described above in the "Hole Transport Layer ("HTL") 214" section. The EL solution can include the organic polymers described below in the "Emissive Layer 220" section. The HTL solution can include an aqueous or a non-aqueous solvent. An example of the aqueous solvent is water, and examples of the non-aqueous solvents are organic solvents or acids such as, for example, methanol, ethanol, toluene, xylene, dimethylpropylene urea, hydrogen chloride, or chloroform. The EL solution can also include an aqueous or a non-aqueous solvent. An example of the aqueous solvent is water, and examples of the non-aqueous solvents are the organic solvents or acids listed earlier. Examples of surfactants added to the HTL solution are: isoproponal alcohol, methanol, or triton. An example of the surfactant added to the EL solution is: sodium dodecylsulfate.

In a second configuration of the first embodiment of the OLED device, the HTL 214, the intermixed layer 217, and the emissive layer 220 are each comprised of multiple components and each of these three layers have at least one common component. Specifically, for example, at least one of the components of the HTL 214 is also at least one of the components of the intermixed layer 217 and the emissive layer 220. More specifically, for example, if the HTL 214 is comprised of PEDOT:PSS, then one of the components of the emissive layer 220 is PEDOT and one of the components of the intermixed layer 217 is also PEDOT. Alternatively, the common component in these three layers can be polythiophene or PSS.

In this second configuration, the OLED device is formed by adding at least one of the components of the HTL solution to the EL solution. The HTL 214 is formed on the anode 211 by depositing the HTL solution on the anode 211 and allowing the HTL solution to dry. Then, the EL solution that includes at least one component of the HTL solution is deposited on the HTL 214. The deposited EL solution dissolves a portion of the HTL 214 at the interface thus producing an intermixed solution. The intermixed solution and the EL solution are allowed to dry to form an intermixed layer 217 on the HTL 214 and an emissive layer 220 on the intermixed layer 217. By adding at least one of the components of the HTL solution to the EL solution, the common components are attracted to each other thus improving the robustness of the interface (e.g., the adhesion) between (1) the emissive layer 220 and the intermixed layer 217, and (2) the intermixed layer 217 and the HTL 214. Also, the amount of intermixing between the HTL 214 and the EL solution increases thus increasing the number of holes injected into the emissive layer.

In a third configuration of the first embodiment of the OLED device, the HTL 214 is formed from a HTL solution that uses a first non-aqueous solvent to dissolve the organic polymers that the resulting HTL is comprised of, and the emissive layer 220 is formed from a EL solution that uses a second non-aqueous solvent to dissolve the organic polymers that the resulting emissive layer is comprised of. The first non-aqueous solvent completely dissolves the multiple organic polymers that the resulting HTL is comprised of, and the second non-aqueous solvent only partially dissolves these multiple organic polymers. Since the second non-aqueous solvent partially dissolves the organic polymers that the resulting HTL 214 is comprised of, the second non-aqueous solvent will dissolve a greater portion of the HTL than if the HTL was comprised of organic polymers that dissolved in an aqueous solvent. Since the EL solution partially dissolves the HTL 214, there is more intermixing between the HTL 214 and the EL solution thus the emissive layer will have a stronger adhesion to the intermixed layer and also the number of holes injected into the emissive layer will increase.

In this configuration, the OLED device is fabricated by depositing a HTL solution on the anode and this HTL solution uses a first non-aqueous solvent to dissolve the organic polymers that the resulting HTL 214 is comprised of. Then, the deposited HTL solution is allowed to dry so as to form the HTL 214. An EL solution is deposited on the HTL 214 and this EL solution uses a second non-aqueous solvent to dissolve the organic polymers that the resulting emissive layer is comprised of. The second non-aqueous solvent of the EL solution partially dissolves the HTL 214 thus producing an intermixed solution at the interface. The intermixed solution and the EL solution are allowed to dry to form an intermixed layer on the HTL 214, and an emissive layer on the intermixed layer. Then, a cathode is formed on the emissive layer.

The resulting HTL 214 is comprised of organic polymers such as, for example, those described above in the "Hole Transport Layer ("HTL") 214" section. Examples of the first non-aqueous solvent that dissolves the organic polymers that the resulting HTL 214 is comprised of are organic solvents or acids such as, for example, methanol, ethanol, toluene, xylene, dimethylchloride, dimethylpropylene urea, hydrogen chloride, or chloroform. The resulting emissive layer is comprised of the organic polymers such as, for example, those described below in the "Emissive Layer 220" section. An example of the second non-aqueous solvent that dissolves the organic polymers that the resulting emissive layer is comprised of and that partially dissolves the organic polymers that the resulting HTL is comprised of are organic solvents such as toluene or xylene.

In a fourth configuration of the first embodiment of the OLED device, the dried HTL, intermixed layer, and emissive layer are baked together in order to increase the amount of intermixing between the HTL and the emissive layer. Here, a HTL solution is deposited on the anode 211 and the HTL solution is allowed to dry to form a HTL 214 on the anode 211. Then, an EL solution is deposited on the HTL 214. A portion of the EL solution dissolves a portion of the HTL 214 at the interface thus producing an intermixed solution. The intermixed solution and the EL solution are allowed to dry to form an intermixed layer 217 on the HTL 214, and an emissive layer 220 on the intermixed layer 217. Then, the HTL 214, the intermixed layer 217, and the emissive layer 220 are baked to increase the intermixing between the HTL 214 and the emissive layer 220. By increasing the amount of intermixing between the HTL 214 and the emissive layer 220 there will be stronger adhesion between the emissive layer and the intermixed layer and also the number of holes injected into the emissive layer will increase.

In this fourth configuration, the HTL solution is comprised of the organic polymers such as, for example, those described above in the "Hole Transport Layer ("HTL") 214" section. The EL solution is comprised of the organic polymers such as, for example, those described below in the "Emissive Layer 220" section. In the HTL solution, an aqueous or a non-aqueous solvent can be used to dissolve the organic polymers that the resulting HTL is comprised of. An example of the aqueous solvent is water, and examples of the non-aqueous solvent are organic solvents or acids such as, for example, methanol, ethanol, toluene, xylene, dimethylpropylene urea, hydrogen chloride, or chloroform. In the EL solution, an aqueous or a non-aqueous solvent can be used to dissolve the organic polymers that the resulting emissive layer is comprised of. An example of the aqueous solvent is water, and examples of the non-aqueous solvent are organic solvents such as toluene or xylene. The three layers are baked at a temperature between 50° C. and 300° C., preferably, between 130° C. and 200° C. The three layers together are baked for a time between one minute and twenty-four hours, preferably, for a time between five minutes and one hour.

Emissive Layer 220:

The emissive layer 220 is comprised of organic electroluminescent polymers. Preferably, the organic polymers are fully or partially conjugated polymers. For example, suitable organic polymer materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene), poly(2,7-(9,9-di-n-octylfluorene)-(1,4-phenylene-((4-methylphenyl) imino)-1,4-phenylene-((4-methylphenyl)imino)-1,4-phenylene)), poly(2,7-(9,9-di-n-octylfluorene)-(1,4-phenylene-((4-methoxyphenyl)imino)-1,4-phenylene)), poly (2,7-(9,9-di-n-octylfluorene), (2,7-(9,9-di-n-octylfluorene)-3,6-Benzothiadiazole), or poly(9,9-dioctylfluorene). Other examples include random or block copolymers of the above polymers.

A preferred organic electroluminescent material that emits blue light is available as blue polymer by Dow Chemical, Midland, Mich. (a polyfluorene based polymer); another electroluminescent material is polyspirofluorene like polymers available from Covion Organic Semiconductors GmbH, Frankfurt, Germany. Other blue emitting polymers are, for example, poly(9,9-dialkyl fluorene), poly(9,9-diaryl fluorene), polyphenylenes, poly(2,5-dialkyl phenylene), copolymers of these materials, or copolymers with monomers comprising arylamine units.

An organic electroluminescent material that emits yellow light and includes polyphenelenevinylene derivatives is available as PDY132 from Covion Organic Semiconductors GmbH, Industrial park Hoechst, Frankfurt, Germany. Yet another organic electroluminescent material that emits green light and includes fluorene-copolymers is available as Lumation Green 1300 series from Dow Chemical, Midland, Mich.

Such organic polymer materials are well known in the art and are described in, for example, Bredas, J.-L., Silbey, R., eds., Conjugated Polymers, Kluwer Academic Press, Dordrecht (1991).

The thickness of the emissive layer 220 is from about 5 nm to about 500 nm, and preferably, from about 20 nm to about 100 nm.

The emissive layer 220 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

Cathode 223:

The cathode 223 is a conductive layer that serves as an electron-injecting layer. The cathode 223 is comprised of one or more low work function materials. The cathode 223 is typically a multilayer structure that includes, for example, a thin electron injection layer and a thick conductive layer. The electron injection layer has a lower work function than the conductive layer. The electron injection layer can be comprised of, for example, low work function metals such as barium, calcium, magnesium, lithium or mixtures thereof. The conductive layer can be comprised of, for example, aluminum, aluminum alloys, silver, or mixtures thereof.

The cathode 223 can be opaque, transparent, or semi-transparent to the wavelength of light generated within the device. The thickness of the cathode 223 is from about 10 nm to about 1000 nm, preferably from about 50 nm to about 500 nm, and more preferably, from about 100 nm to about 300 nm.

The cathode 223 can typically be fabricated using any of the techniques known in the art for deposition of thin films, including, for example, vacuum evaporation, sputtering, electron beam deposition, or chemical vapor deposition.

Alternatively, in another embodiment of the OLED device, the cathode layer, rather than the anode layer, is deposited on the substrate. In this case, the emissive layer is deposited on the cathode layer, and the intermixed layer is deposited on the emissive layer. The HTL is deposited on the intermixed layer, and the anode is deposited on the HTL. This resulting device represents, for example, a top-emitting OLED device.

Figure 4:
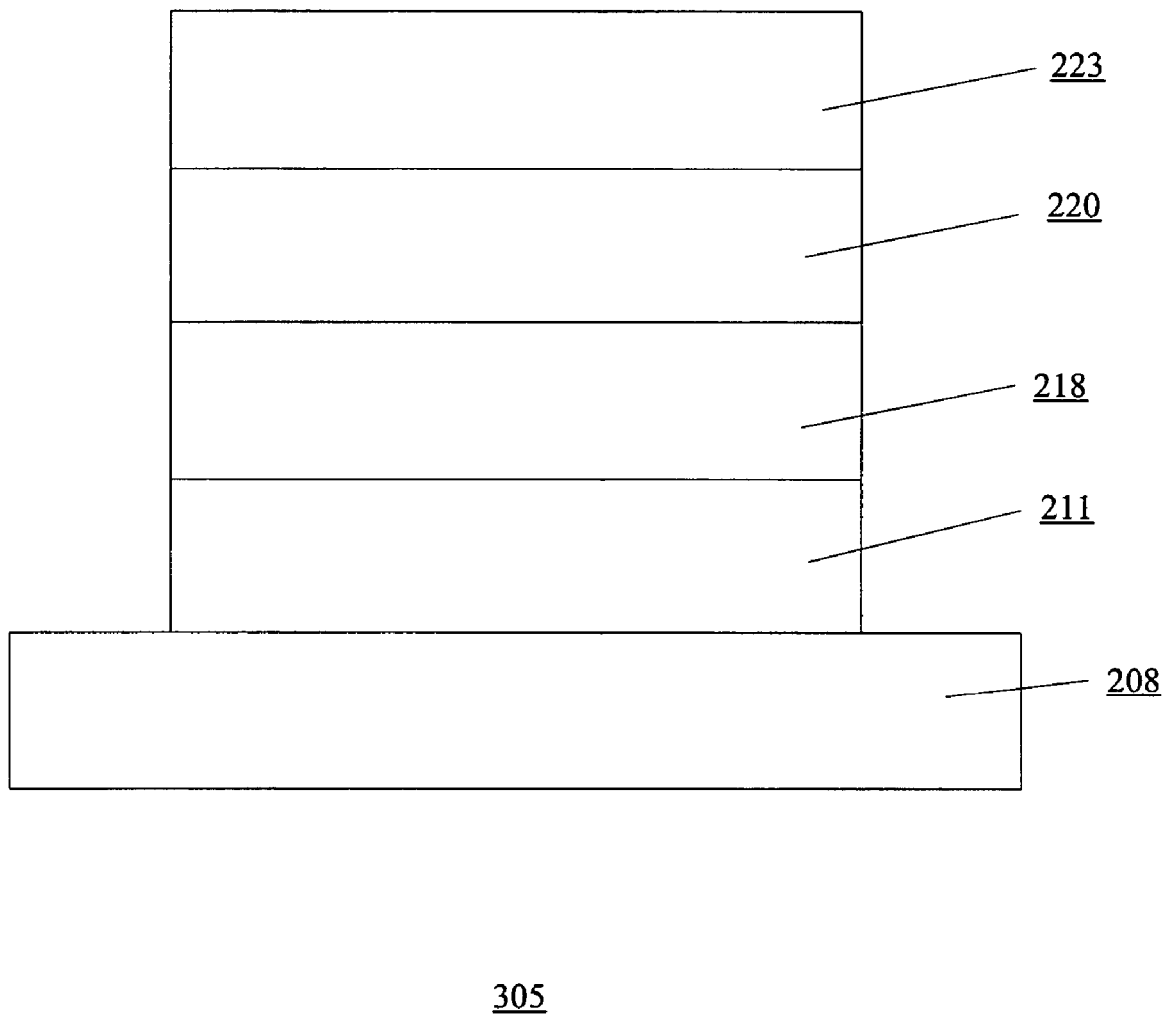
FIG. 4 shows a cross-sectional view of a second embodiment of an OLED device according to the present invention.

The HTL may be comprised of materials such as PEDOT:PSS which contain many impurities. These impurities can contribute to decreased device performance such as, for example, shorter device lifetime. Also, the HTL is a semiconductive material that increases the resistance of the device thus increasing the voltage needed to drive the device. Typically, as the operating voltage is increased, the device lifetime decreases. Therefore, alternatively, in order to improve device performance and decrease the operating voltage, the HTL may be eliminated from the device structure. FIG. 4 shows a cross-sectional view of a second embodiment of an OLED device 305 according to the present invention. In this embodiment, a separate interlayer 218 replaces the HTL, i.e., the HTL is absent from the device structure. In FIG. 4, an anode 211 is on a substrate 208. An interlayer 218 is on the anode 211. An emissive layer 220 is on the interlayer 218. A cathode 223 is on the emissive layer 220. The OLED device 305 may include other layers such as, for example, insulating layers between the anode 211 and the interlayer 218, and/or between the emissive layer 220 and the cathode 223.

In one configuration of the interlayer 218, the interlayer 218 is comprised of a hole transport material in which one of the components is at least partially replaced with one of the components of the emissive layer 220 that is responsible for hole injection and transport. In this case, the presence of the common component in the two separate layers enhances the wetting and adhesion of the two layers. By having the common component in the two separate layers, the interlayer 218 will be more compatible with the emissive layer 220 (e.g., there will be increased intermixing between the two layers) thus increasing the number of holes that are injected into the emissive layer 220.

The OLED device is fabricated by forming an anode 211 on a substrate 208, and then forming an interlayer 218 on the anode 211. Then, an emissive layer 220 is formed on the interlayer 218; the emissive layer 220 includes multiple first components, and one of the first components is responsible for hole injection and transport. Then, a cathode 223 is formed on the emissive layer 220. The interlayer 218 is comprised of a hole transport material that includes multiple second components, and at least some of one of the second components is replaced with the particular first component that is responsible for hole injection and transport. The polymers of the interlayer 218 can be produced by polymerizing the components of the emissive layer 220 that are responsible for hole injection and transport with the other components of the hole transport material of the interlayer 218. The interlayer 218 has a range of ionization potentials ("IPs") between a highest IP of an adjacent layer on an anode-end and a lowest IP of an adjacent layer on an "emissive layer"-end.

Specifically, if the emissive layer is comprised of polyfluorene-based polymers, then the interlayer can be comprised of a variant of PEDOT:PSS where at least some of the PSS components in the PEDOT:PSS are replaced with the component responsible for hole injection and transport in the emissive layer. Examples of such hole injection and transport components are triarylamines and their derivatives. Other components can be incorporated onto the main chain between the two main components (i.e., the EDOT and the triarylamine) to facilitate synthesis of the interlayer. Specifically, aliphatic groups or other molecules or atoms such as oxygen can be incorporated onto the main chain between the two main components to facilitate synthesis.

Figure 5A:
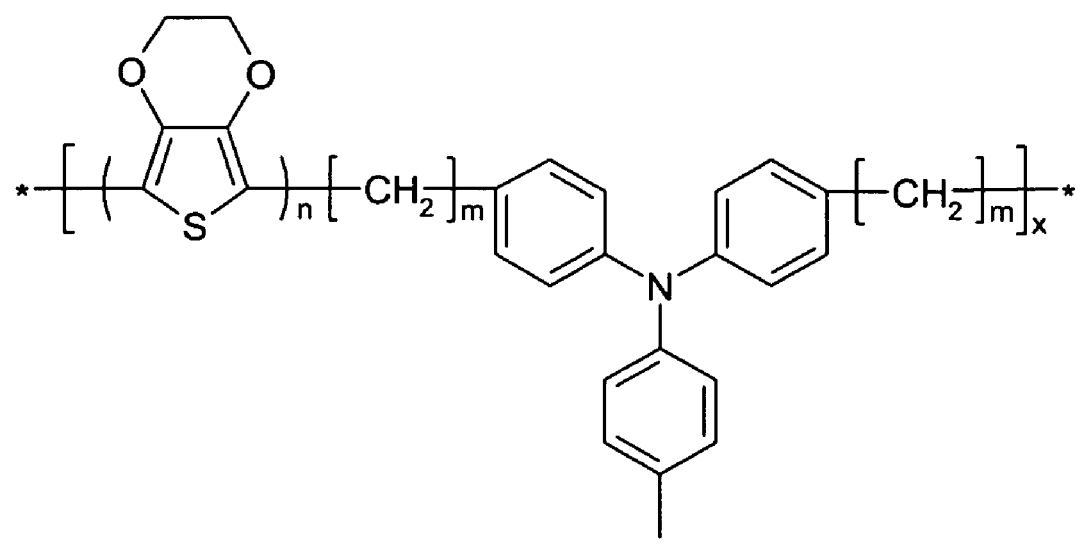
FIGS. 5a-b schematically shows different configurations of the repeating components of a main chain of the intermixed layer.
Figure 5B:
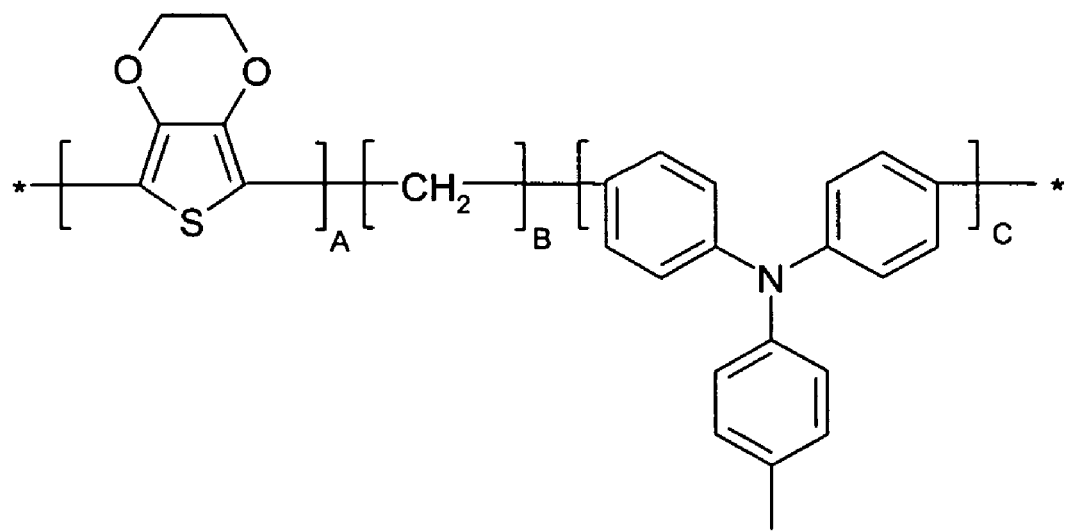

FIGS. 5a-b schematically shows different configurations of the repeating components of a main chain of the interlayer 218. The two main components, EDOT and triarylamine, can directly link with each other. Alternatively, as shown in FIGS. 5a-b, aliphatic groups can be incorporated onto the main chain between the two main components (i.e., the EDOT and the triarylamine) to facilitate synthesis. FIG. 5a shows a homopolymer in which the repeating unit of the main chain includes the EDOT, the aliphatic groups, and the triarylamine. In FIG. 5a, a "X" represents the number of repeating units of the main chain and the value of "X" is much greater than one. A "n" represents the number of EDOT components and this number is typically from 1 to 20. A "m" represents the number of aliphatic groups and this number is typically from 1 to 50; preferably is from 1 to 10; and more preferably is from 1 to 5. FIG. 5b shows a block copolymer in which the main chain includes blocks of the EDOT, blocks of the aliphatic groups, and blocks of the triarylamine. In FIG. 5b, a "A" represents the number of EDOT components in a block and this number is greater than one. A "B" represents the number of aliphatic groups in a block and this number is greater than one. A "C" represents the number of triarylamines in a block and this number is greater than one.

The interlayer 218 can be used in conjunction with a HTL, or the interlayer 218 can replace the HTL (as shown in FIG. 4). In both cases, the interlayer 218 is employed within the OLED device to improve adhesion between the emissive layer 220 and the underlying layer and also increase the number of holes injected into the emissive layer 220.

The OLED devices described earlier can be used within displays in applications such as, for example, computer displays, information displays in vehicles, television monitors, telephones, printers, and illuminated signs. Alternatively, the OLED devices can be used within an OLED light source for general purpose lighting.

As any person of ordinary skill in the art of OLED device fabrication will recognize from the description, figures, and examples that modifications and changes can be made to the embodiments of the invention without departing from the scope of the invention defined by the following claims.

What is claimed:

1. An OLED device, comprising:
   a substrate;
   an anode on said substrate;
   an interlayer on said anode;
   an emissive layer on said interlayer, wherein said emissive layer includes a plurality of first components that are responsible for hole injection and transport; and
   a cathode on said emissive layer, wherein said interlayer includes a hole transport material having a plurality of second components and a plurality of third components, wherein a particular one of said plurality of second components is the same said plurality of first components that are responsible for hole injection and transport in the emissive layer, wherein said plurality of second components of the interlayer are polymerized with a particular one of said plurality of third components, wherein said interlayer has a range of IPs between a highest IP of an adjacent layer on an anode-end and a lowest IP of an adjacent layer on an "emissive layer"-end, and wherein said interlayer is formed directly on said anode.

2. The OLED device of claim 1, wherein said plurality of first components that are responsible for hole injection and transport are amines.

3. The OLED device of claim 2, wherein said amines are triarylamines.

4. The OLED device of claim 1, wherein said plurality of third components are responsible for hole injection and transport, wherein the OLED device further comprises a main chain which includes an aliphatic group between said particular one of said plurality of second components and said particular one of said plurality of third components, and wherein said aliphatic group facilitates synthesis of said interlayer.

5. The OLED device of claim 1, wherein said interlayer is free of an electroluminescent material.

6. An OLED device, comprising:
a substrate;
an anode on said substrate;
an interlayer on said anode;
an emissive layer on said interlayer, wherein said emissive layer includes a plurality of first components that are responsible for hole injection and transport; and
a cathode on said emissive layer,
wherein said interlayer includes a hole transport material having a plurality of second components and a plurality of third components,
wherein a particular one of said plurality of second components is the same as said plurality of first components that are responsible for hole injection and transport in the emissive layer,
wherein said plurality of second components of the interlayer are polymerized with a particular one of said plurality of third components,
wherein said interlayer has a range of IPs between a highest IP of an adjacent layer on an anode-end and a lowest IP of an adjacent layer on an "emissive layer"-end, and
wherein said interlayer is free of an electroluminescent material.

7. The OLED device of claim 6, further comprising a hole transport layer between said anode and said interlayer.

8. The OLED device of claim 6, wherein said plurality of first components that are responsible for hole injection and transport are amines.

9. The OLED device of claim 8, wherein said amines are triarylamines.

10. The OLED device of claim 6, wherein said plurality of third components are responsible for hole injection and transport, wherein the OLED device further comprises a main chain which includes an aliphatic group between said particular one of said plurality of second components and said particular one of said plurality of third components, and wherein said aliphatic group facilitates synthesis of said interlayer.

11. The OLED device of claim 6, wherein said interlayer is formed directly on said anode.

* * * * *